US008937517B2

(12) United States Patent
Huang et al.

(10) Patent No.: US 8,937,517 B2
(45) Date of Patent: Jan. 20, 2015

(54) SPLITTER

(75) Inventors: Chen-Chia Huang, Hsinchu (TW); Chun-Feng Yang, Hsinchu (TW)

(73) Assignee: Wistron NeWeb Corporation, Hsinchu Science Park, Hsinchu (TW)

( * ) Notice: Subject to any disclaimer, the term of this patent is extended or adjusted under 35 U.S.C. 154(b) by 248 days.

(21) Appl. No.: 13/549,524

(22) Filed: Jul. 16, 2012

(65) Prior Publication Data

US 2013/0241671 A1 Sep. 19, 2013

(30) Foreign Application Priority Data

Mar. 15, 2012 (TW) ............................. 101108835 A

(51) Int. Cl.
*H01P 5/12* (2006.01)
*H03H 7/46* (2006.01)

(52) U.S. Cl.
USPC ............ 333/128; 333/126; 333/129; 333/132

(58) Field of Classification Search
USPC .................................. 333/126–130, 132, 134
See application file for complete search history.

(56) References Cited

U.S. PATENT DOCUMENTS

| | | | | |
|---|---|---|---|---|
| 3,691,485 | A * | 9/1972 | Beck | 333/123 |
| 3,953,702 | A * | 4/1976 | Bickel | 219/761 |
| 4,367,445 | A * | 1/1983 | Dydyk | 333/127 |
| 4,386,324 | A * | 5/1983 | Schellenberg | 330/277 |
| 5,206,611 | A * | 4/1993 | Russell | 333/127 |
| 6,121,853 | A * | 9/2000 | London | 333/125 |
| 6,472,950 | B1 * | 10/2002 | London | 333/125 |
| 6,570,466 | B1 * | 5/2003 | Bahl | 333/128 |
| 6,822,531 | B2 * | 11/2004 | Carlson | 333/104 |
| 7,973,617 | B2 * | 7/2011 | Yurugi et al. | 333/128 |
| 8,063,716 | B1 * | 11/2011 | Ives | 333/131 |

* cited by examiner

*Primary Examiner* — Robert Pascal
*Assistant Examiner* — Kimberly Glenn
(74) *Attorney, Agent, or Firm* — Winston Hsu; Scott Margo

(57) ABSTRACT

A splitter includes an input terminal, a first output terminal, a second output terminal, a first transmitting unit including a first microstrip coupled between the input terminal and a first node, a second microstrip coupled between the input terminal and a second node, and a first resistor coupled between the first node and the second node, and a second transmitting unit including a third microstrip coupled between the first node and the first output terminal, a fourth microstrip coupled between the second node and the second output terminal, and a second resistor coupled between the first output terminal and the second output terminal, wherein lengths of the first microstrip and the second microstrip are related to a first frequency, and lengths of the third microstrip and the fourth microstrip are related to a second frequency.

7 Claims, 11 Drawing Sheets

SPLITTER

BACKGROUND OF THE INVENTION

1. Field of the Invention

The present invention relates to a splitter, and more particularly, to a splitter capable of allowing output terminals to be conductive within certain frequency bands and isolated at other frequencies.

2. Description of the Prior Art

A splitter is a signal transmitting device mostly utilized in electronic apparatuses for splitting a single signal source from one input terminal to a plurality of output terminals. In such a condition, basic design requirements of the splitter include low insertion loss from the input terminal to each output terminal and high insertion loss between the output terminals, in order to reach high conductivity between the input terminal and each output terminal, and high isolation between the output terminals, so as to avoid signals between the output terminals interfering with each other or load variation affecting transmitting characteristics.

However, some applications may require lower isolation within a certain frequency band and higher isolation at other frequencies between the output terminals of the splitter. In other words, in operating frequency bands of the splitter, the output terminals may be conductive within a certain frequency band and isolated at other frequencies. Such a design requirement cannot be achieved by utilizing the conventional splitter. Therefore, there is a need to redesign a splitter complying with this requirement.

SUMMARY OF THE INVENTION

Therefore, the present invention provides a splitter capable of allowing output terminals to be conductive within certain frequency bands and isolated at other frequencies.

An embodiment of the present invention discloses a splitter, which comprises an input terminal; a first output terminal; a second output terminal; a first transmitting unit, comprising a first microstrip, coupled between the input terminal and a first node; a second microstrip, coupled between the input terminal and a second node; and a first resistor, coupled between the first node and the second node; and a second transmitting unit, comprising a third microstrip, coupled between the first node and the first output terminal; a fourth microstrip, coupled between the second node and the second output terminal; and a second resistor, coupled between the first output terminal and the second output terminal. Lengths of the first microstrip and the second microstrip are substantially equal to a first length related to a first frequency, lengths of the third microstrip and the fourth microstrip are substantially equal to a second length related to a second frequency, and the first frequency and the second frequency are different.

Another embodiment of the present invention discloses a splitter, which comprises an input terminal; a plurality of output terminals; and a plurality of transmitting units, serially connected as a sequence, each transmitting unit comprising a resistor node; a plurality of front-stage nodes; a plurality of back-stage nodes; a plurality of microstrips, coupled between the plurality of front-stage nodes and the plurality of back-stage nodes; and a plurality of resistors, each coupled between a back-stage node and the resistor node. The plurality of front-stage nodes of a forefront transmitting unit among the plurality of transmitting units are coupled to the input terminal, the plurality of back-stage nodes of a last transmitting unit among the plurality of transmitting units are coupled to the plurality of output terminals, and the plurality of back-stage nodes of a former transmitting unit of two adjacent transmitting units are the plurality of front-stage nodes of a latter transmitting unit of the two adjacent transmitting units; lengths of the plurality of microstrips of each transmitting unit are substantially equal and related to a frequency, and the plurality of transmitting units are related to a plurality of frequencies according to microstrip lengths, such that the plurality of transmitting units are divided into a plurality of transmitting unit modules according to the lengths of the plurality of microstrips of each transmitting unit.

These and other objectives of the present invention will no doubt become obvious to those of ordinary skill in the art after reading the following detailed description of the preferred embodiment that is illustrated in the various figures and drawings.

DETAILED DESCRIPTION

In order to allow the output terminals of the splitter to be conductive within certain frequency bands and isolated at other frequencies, the present invention utilizes transmitting units with different microstrip lengths to achieve the purpose.

Figure 1:
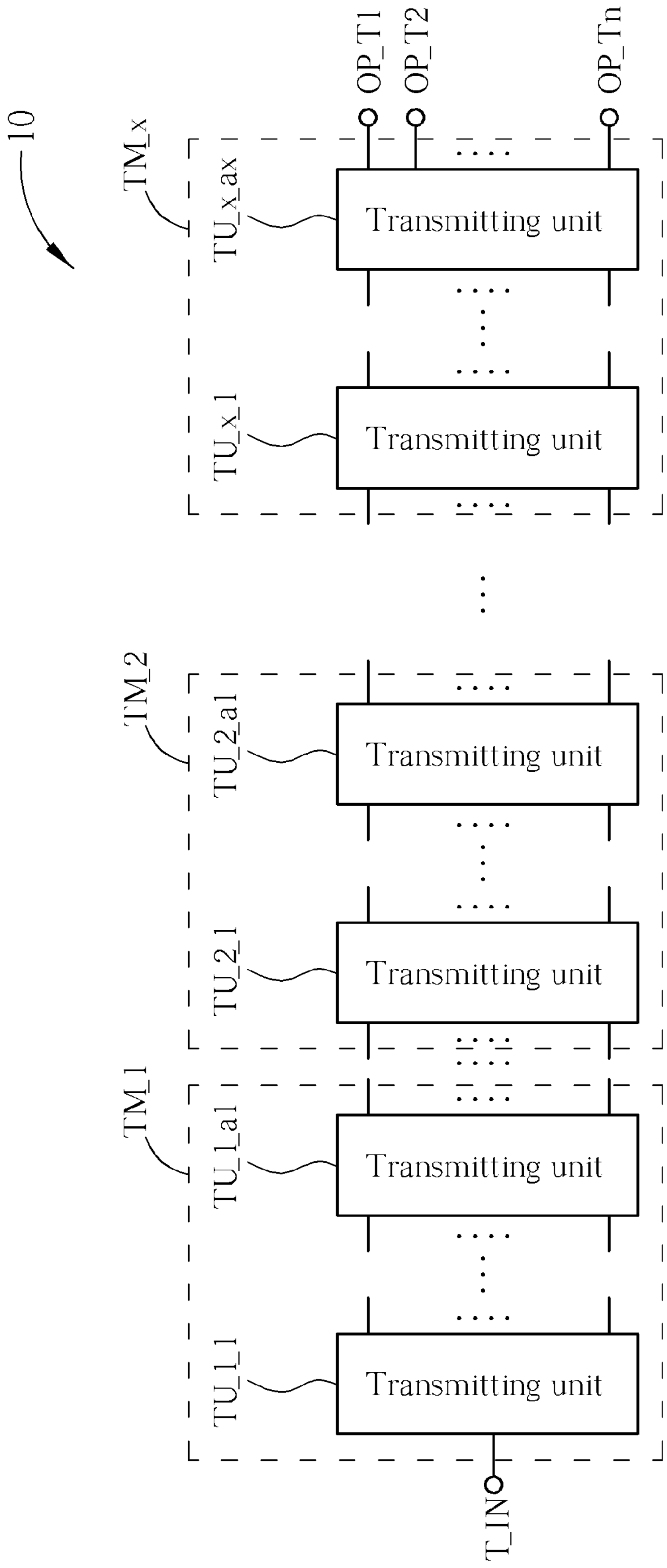
FIG. 1 is a schematic diagram of a splitter according to an embodiment of the present invention.

Please refer to FIG. 1. FIG. 1 is a schematic diagram of a splitter 10 according to an embodiment of the present invention. The splitter 10 is utilized for splitting a single signal source from an input terminal T_IN to output terminals OP_T1-OP_Tn, and mainly composed of transmitting unit modules TM_1-TM_x. The transmitting unit modules TM_1-TM_x include transmitting units TU_1_1-TU_1_a1, TU_2_1-TU_2_a2 . . . TU_x_1-TU_x_ax, respectively. Structures of the transmitting units TU_1_1-TU_1_a1, TU_2_1-TU_2_a2 . . . TU_x_1-TU_x_ax are substantially the same, with a main difference of the microstrip lengths in each transmitting unit.

Figure 2:
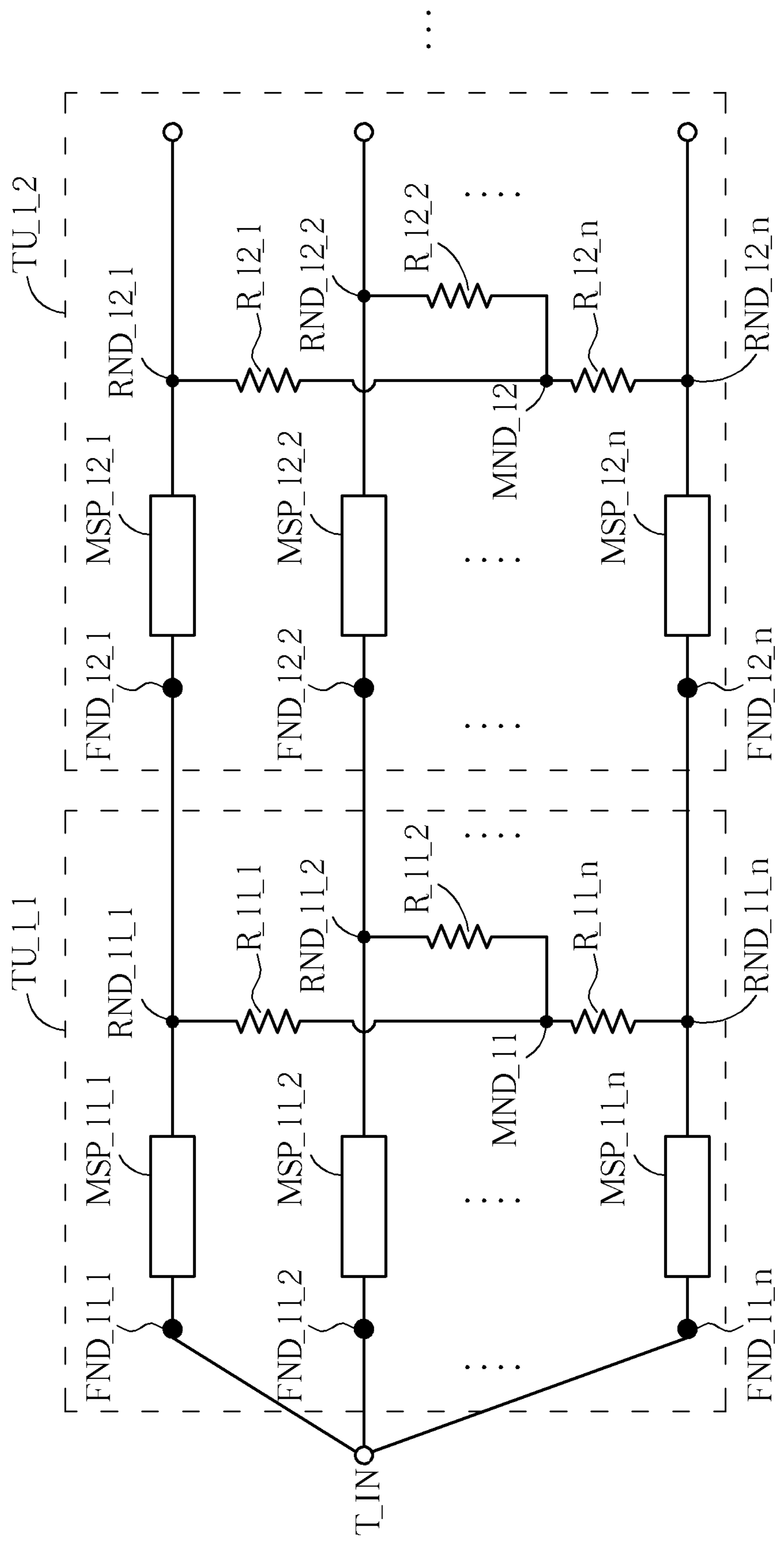
FIG. 2 is a schematic diagram of a detailed structure of the transmitting units in FIG. 1.

In detail, please refer to FIG. 2, which is a schematic diagram of detailed structures of the transmitting units TU_1_1 and TU_1_2. The transmitting unit TU_1_1 includes a resistor node MND_11, front-stage nodes FND_11_1-FND_11_n, back-stage nodes RND_11_1-RND_11_n, microstrips MSP_11_1-MSP_11_n, and resistors R_11_1-R_11_n. Similarly, the transmitting unit TU_1_2 includes a resistor node MND_12, front-stage nodes FND_12_1-

FND_12_n, back-stage nodes RND_12_1-RND_12_n, microstrips MSP_12_1-MSP_12_n, and resistors R_12_1-R_12_n. By the same token, those skilled in the art should understand that each transmitting unit includes a resistor node, n front-stage nodes, n back-stage nodes, n microstrips, and n resistors. Besides, the front-stage nodes FND_11_1-FND_11_n of the transmitting unit TU_1_1 are all coupled to the input terminal T_IN, and the back-stage nodes RND_11_1-RND_11_n of the transmitting unit TU_1_1 are coupled to the front-stage nodes FND_12_1-FND_12_n of the transmitting unit TU_1_2, respectively. By the same token, it can be known that besides the transmitting unit TU_1_1, the front-stage nodes of each transmitting unit are all coupled to back-stage nodes of a former transmitting unit, and the back-stage nodes of the last transmitting unit TU_x_ax are coupled to the output terminals OP_T1-OP_Tn.

Please note that, since the structures of the transmitting units TU_1_1-TU_1_a1, TU_2_1-TU_2_a2 . . . TU_x_1-TU_x_ax are substantially the same, for simplicity, only the structures of the transmitting units TU_1_1 and TU_1_2 and connection between the transmitting units TU_1_1 and TU_1_2 are shown in FIG. 2. Those skilled in the art can derive connection between other transmitting units accordingly.

After understanding the structure of the splitter 10, an operation method will then be illustrated. As shown above, the structures of the transmitting units TU_1_1-TU_1_a1, TU_2_1-TU_2_a2 . . . TU_x_1-TU_x_ax are substantially the same, with the main difference of the microstrip lengths. In detail, the present invention divides the transmitting units TU_1_1-TU_1_a1, TU_2_1-TU_2_a2 . . . TU_x_1-TU_x_ax into x groups, i.e. the transmitting unit modules TM_1-TM_x, according to the microstrip lengths of the transmitting units. For example, the microstrip lengths of each transmitting unit among the transmitting units TU_1_1-TU_1_a1 in the transmitting unit module TM_1 are substantially equal, e.g. as shown in FIG. 2, lengths of microstrips MSP_11_1-MSP_11_n and microstrips MSP_12_1-MSP_12_n are substantially equal. However, the microstrip lengths of the transmitting units in different transmitting unit modules are different. For example, the microstrip lengths of the transmitting unit TU_1_1 and those of the transmitting unit TU_2_1 are different. According to various embodiments, the microstrip lengths of the transmitting unit TU_1_1 and those of the transmitting unit TU_2_1 can be substantially multiplicative with each other. The microstrip lengths of the transmitting units are related to a frequency band in which a cutoff effect is generated between the output terminals OP_T1-OP_Tn, and are substantially equal to a quarter of a wavelength of a radio frequency signal corresponding to a center frequency of the frequency band preferably. That is, if it is desired to generate a cutoff effect between the output terminals OP_T1-OP_Tn within a frequency band, a transmitting unit module among the transmitting unit modules TM_1-TM_x should be selected according to the center frequency of the frequency band, and the microstrip lengths of the transmitting units in the selected transmitting unit module are specified to be a quarter of a reciprocal of the center frequency, i.e. a wavelength. By the same token, as shown in FIG. 1 for example, all the transmitting units TU_1_1-TU_1_a1, TU_2_1-TU_2_a2 . . . TU_x_1-TU_x_ax include x kinds of different microstrip lengths. The x kinds of different microstrip lengths can make the output terminals OP_T1-OP_Tn nonconductive or isolated within x frequency bands, i.e. similar to the prior art, and conductive at frequencies out of the x frequency bands.

In short, the present invention sets the microstrip lengths of each transmitting unit according to the frequency bands in which high isolation is required between the output terminals OP_T1-OP_Tn, to allow the output terminals OP_T1-OP_Tn to be conductive within some frequency bands, and isolated at other frequencies. Please note that, the embodiments in FIG. 1 and FIG. 2 are results derived from a concept of the present invention, and those skilled in the art can adjust each parameter according to practical requirements, so as to allow the output terminals to be conductive within proper frequency bands and isolated at other frequencies. Definitions of each parameter in the splitter 10 can be summarized as follows:

x: denote an amount of the transmitting unit modules, also denote an amount (or types) of different microstrip lengths in the splitter 10, or can denote an amount of frequency bands required to be high isolation between the output terminals.

n: denote an amount of the output terminals, and relate to amounts of front-stage nodes, back-stage nodes, microstrips, and resistors in each transmitting unit.

a1, a2 . . . ax: denote an amount of the transmitting units in each transmitting unit module.

Therefore, by properly adjusting the above parameters, a splitter can be designed to meet different requirements.

Besides, please note that the transmitting unit modules TM_1-TM_x are defined by the microstrip lengths of the transmitting units, and a way of the transmitting units serially connected is not limited. That is, in FIG. 1, the transmitting units TU_1_1-TU_1_a1, TU_2_1-TU_2_a2 . . . TU_x_1-TU_x_ax in the transmitting unit modules TM_1-TM_x are serially connected as a sequence by means of a grouping way; however, it is only for facilitating the illustration. In practice, the transmitting units TU_1_1-TU_1_a1, TU_2_1-TU_2_a2 . . . TU_x_1-TU_x_ax can also be serially connected as a sequence by means of an interactive way, which can also achieve a purpose of the present invention. The related examples will be narrated hereinafter.

Figure 3:
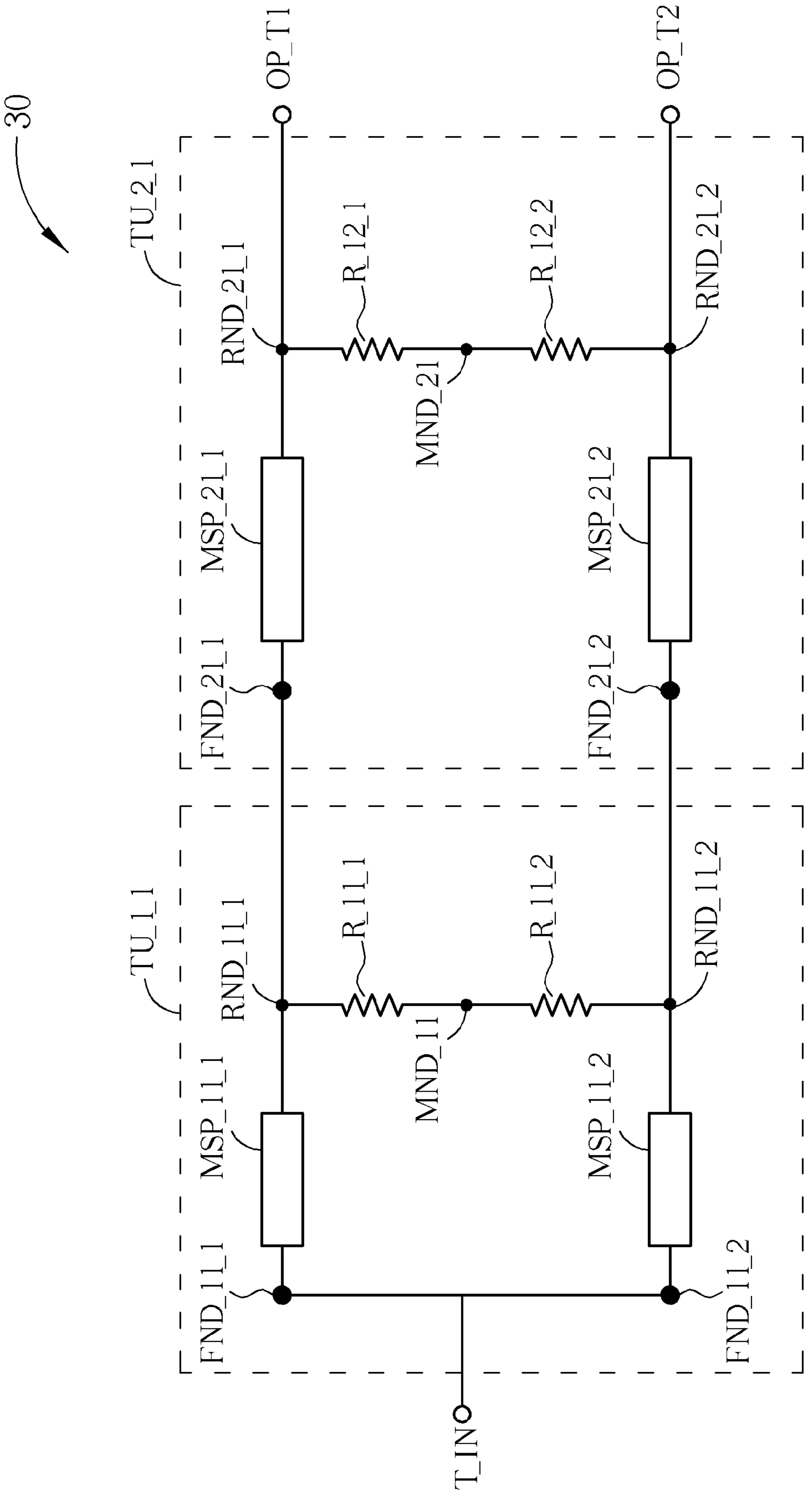
FIG. 3 is a schematic diagram of a splitter according to an embodiment of the present invention.
Figure 4:
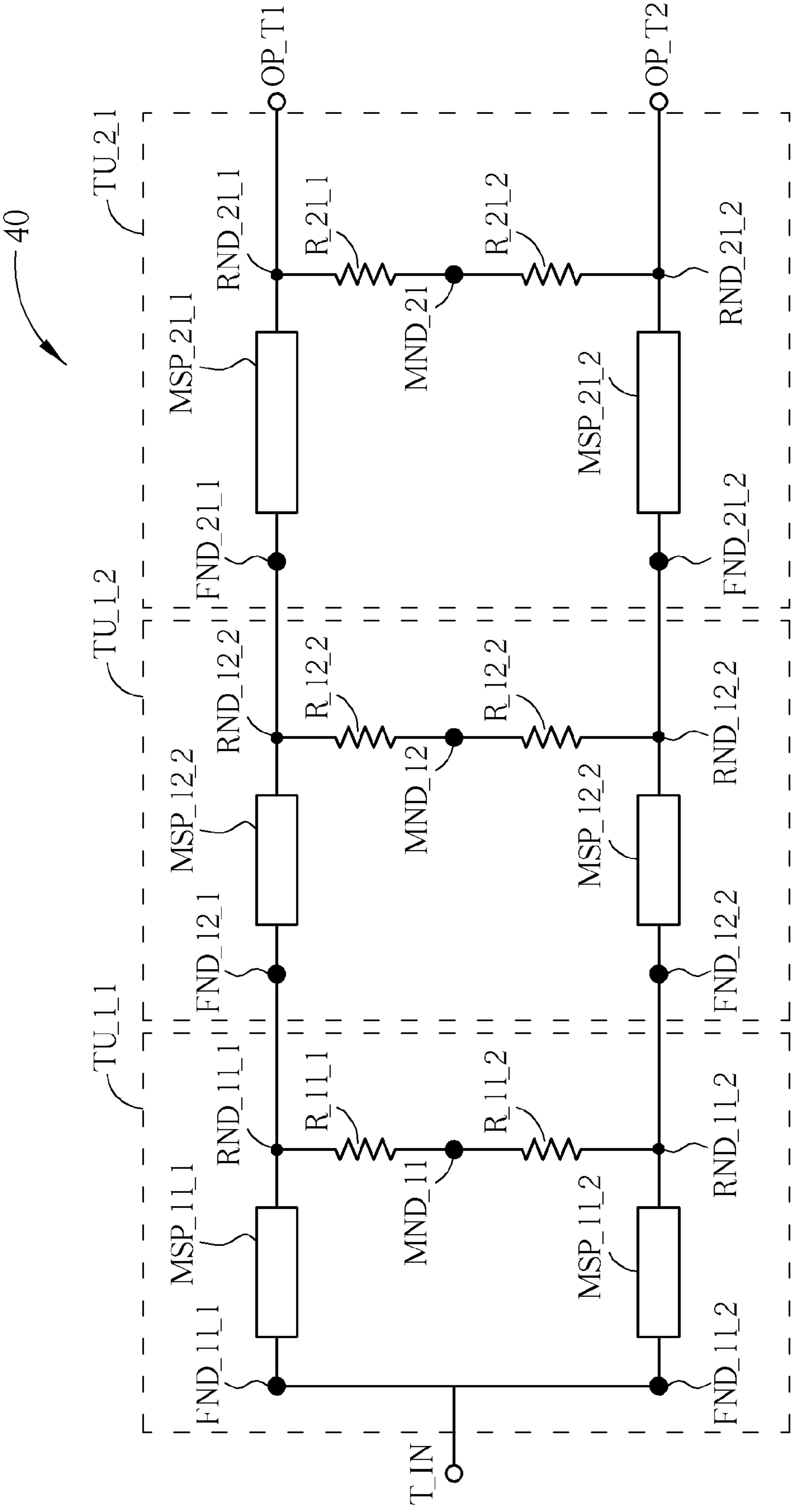
FIG. 4 is a schematic diagram of a splitter according to an embodiment of the present invention.
Figure 5:
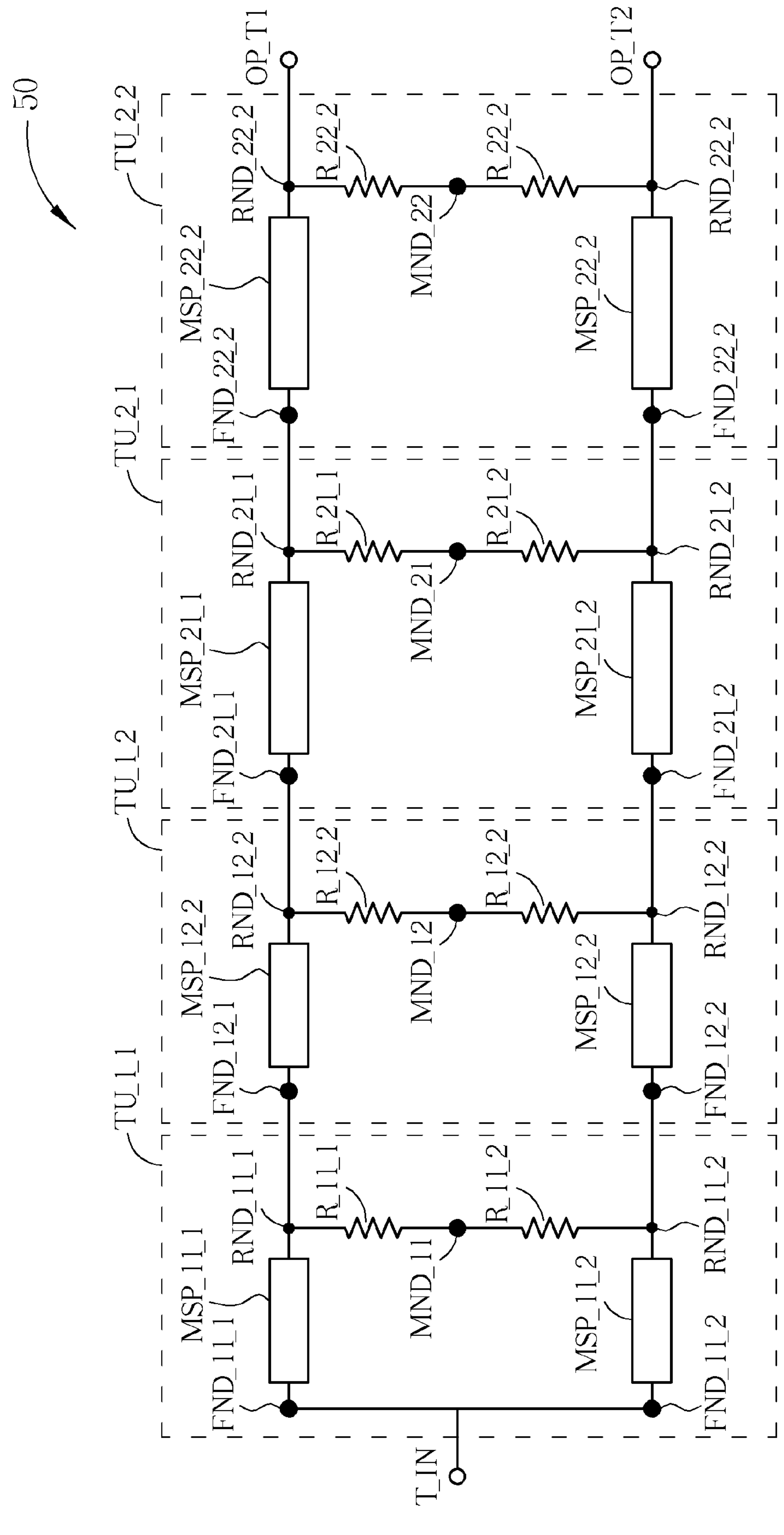
FIG. 5 is a schematic diagram of a splitter according to an embodiment of the present invention.

Please refer to FIG. 3 to FIG. 5. FIG. 3 to FIG. 5 are schematic diagrams of splitters 30, 40, and 50, respectively, according to embodiments of the present invention. The splitters 30, 40, and 50 are derived from the splitter 10, so the same elements are denoted by the same symbols, and since structures of the splitters 30, 40, and 50 are simpler, notations of the transmitting unit modules are omitted, which can be referred to the above illustration. In detail, the splitter 30 is an example of the splitter 10 with x=2, n=2, and a1=a2=1, the splitter 40 is an example of the splitter 10 with x=2, n=2, a1=2, and a2=1, and the splitter 50 is an example of the splitter 10 with x=2, n=2, and a1=a2=2. In other words, the splitters 30, 40, and 50 are all the examples applied to make two output terminals isolated within two frequency bands, and conductive at other frequencies.

Figure 6:
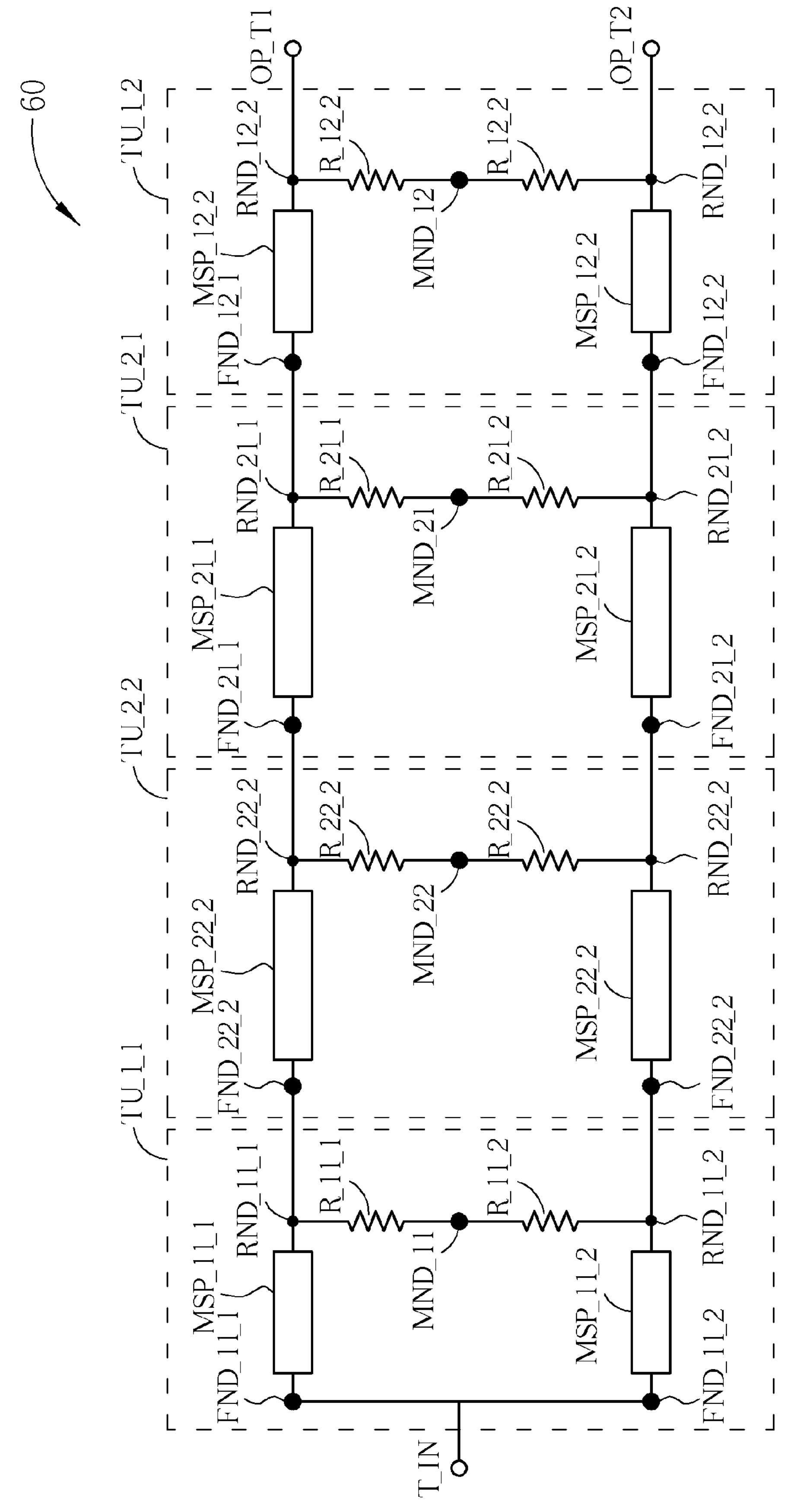
FIG. 6 is a schematic diagram of a splitter according to an embodiment of the present invention.

Besides, as mentioned above, the transmitting units in each transmitting unit module can also be serially connected as a sequence by means of an interactive way; therefore, as shown in FIG. 6, which is a schematic diagram of a splitter 60 according to an embodiment of the present invention. A structure of the splitter 60 is the same as that of the splitter 50, so the same elements are denoted by the same symbols. A difference between the splitter 60 and the splitter 50 is that locations of the transmitting units TU_1_2 and TU_2_2 in the splitter 60 are exchanged. In other words, in the splitter 60, although the transmitting units TU_1_1 and TU_1_2 belong to the same transmitting unit module TM_1, they are arranged interactively with the transmitting units TU_2_1 and TU_2_2 in another transmitting unit module TM_2, such that the output terminals OP_T1 and OP_T2 can also be isolated within two frequency bands (since x=2), and conductive at other frequencies.

Figure 7:
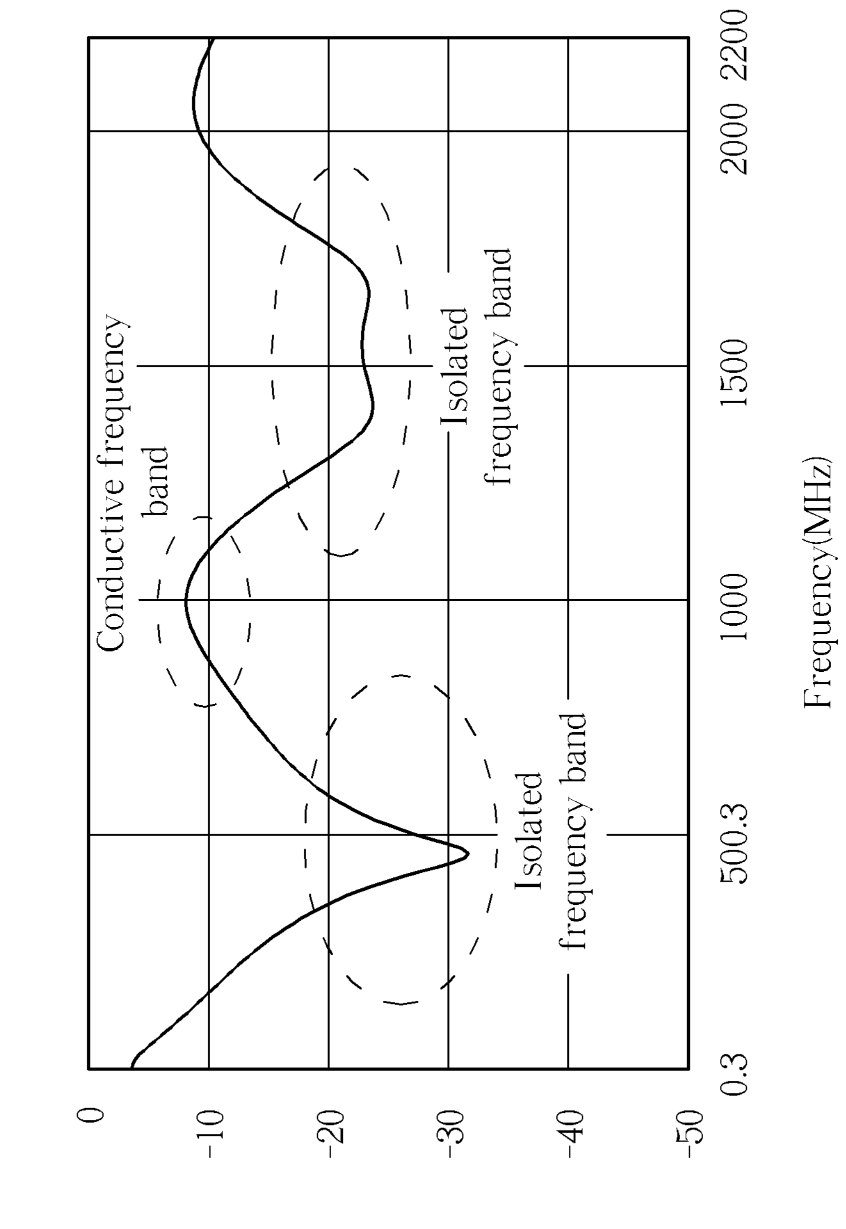
FIG. 7 is a schematic diagram of isolation between the output terminals of the splitter in FIG. 3.
Figure 8:
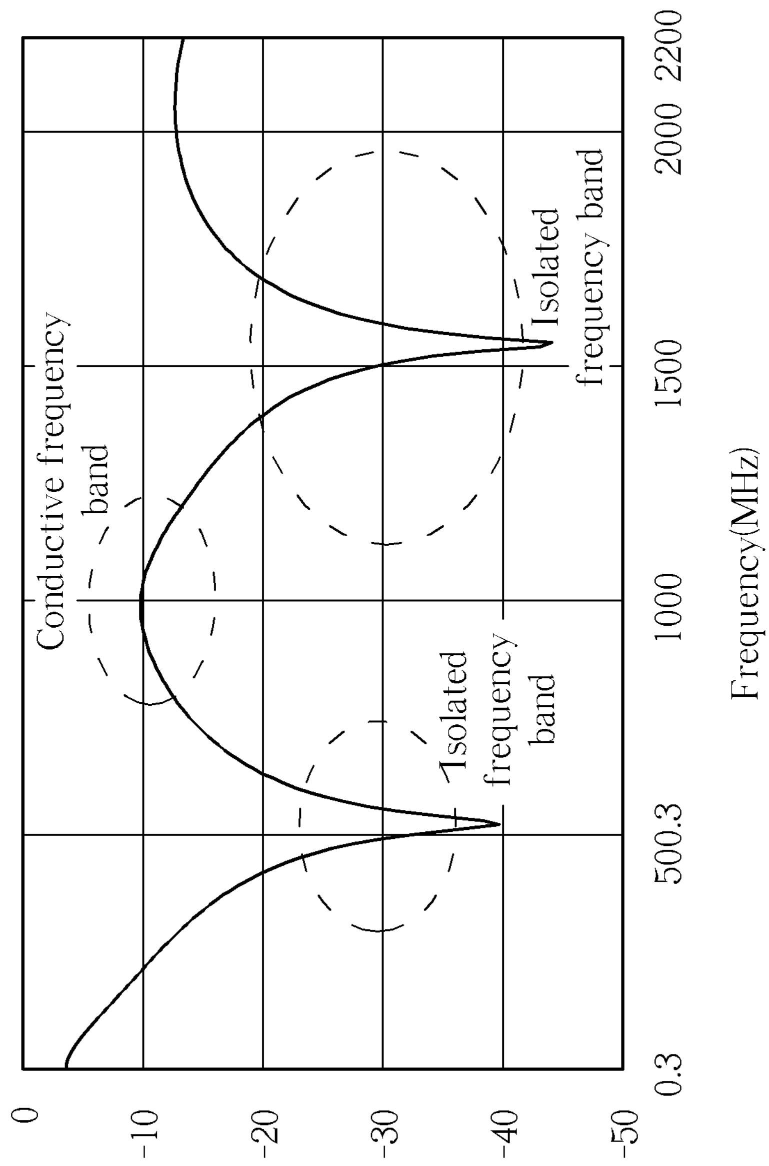
FIG. 8 is a schematic diagram of isolation between the output terminals of the splitter in FIG. 4.
Figure 9:
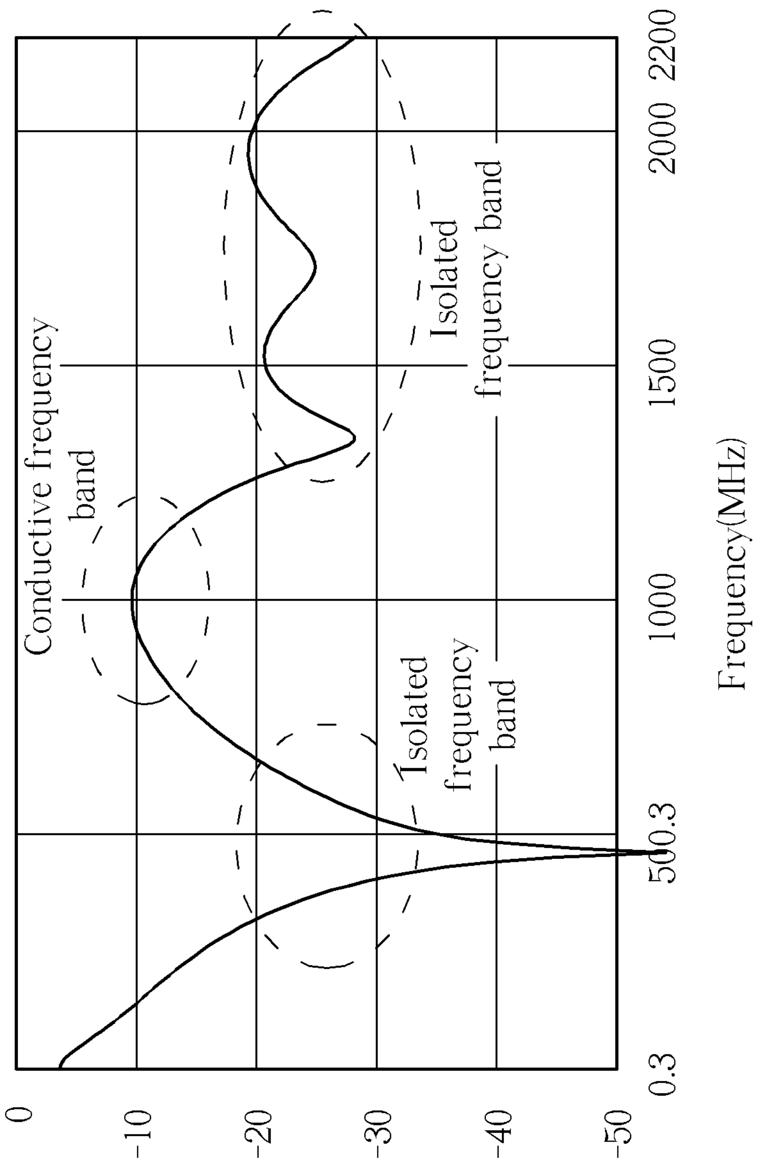
FIG. 9 is a schematic diagram of isolation between the output terminals of the splitter in FIG. 5 or FIG. 6.

Please continue to refer to FIG. 7 to FIG. 9. FIG. 7 is a schematic diagram of isolation between the output terminals of the splitter 30, FIG. 8 is a schematic diagram of isolation between the output terminals of the splitter 40, and FIG. 9 is a schematic diagram of isolation between the output terminals of the splitter 50 or the splitter 60. As shown in FIG. 7 to FIG. 9, the output terminals of the splitters 30, 40, 50, and 60 have higher isolation at frequencies near 500 MHz and 1500 MHz and lower isolation at frequencies near 1000 MHz. Therefore, the output terminals OP_T1 and OP_T2 of the splitters 30, 40, 50, and 60 can be isolated at frequencies near 500 MHz and 1500 MHz, and conductive at other frequencies. In other words, the output terminals OP_T1 and OP_T2 can communicate with each other at frequency bands near 1000 MHz, and preserve a high isolation at frequency bands near 500 MHz and 1500 MHz.

Figure 10:
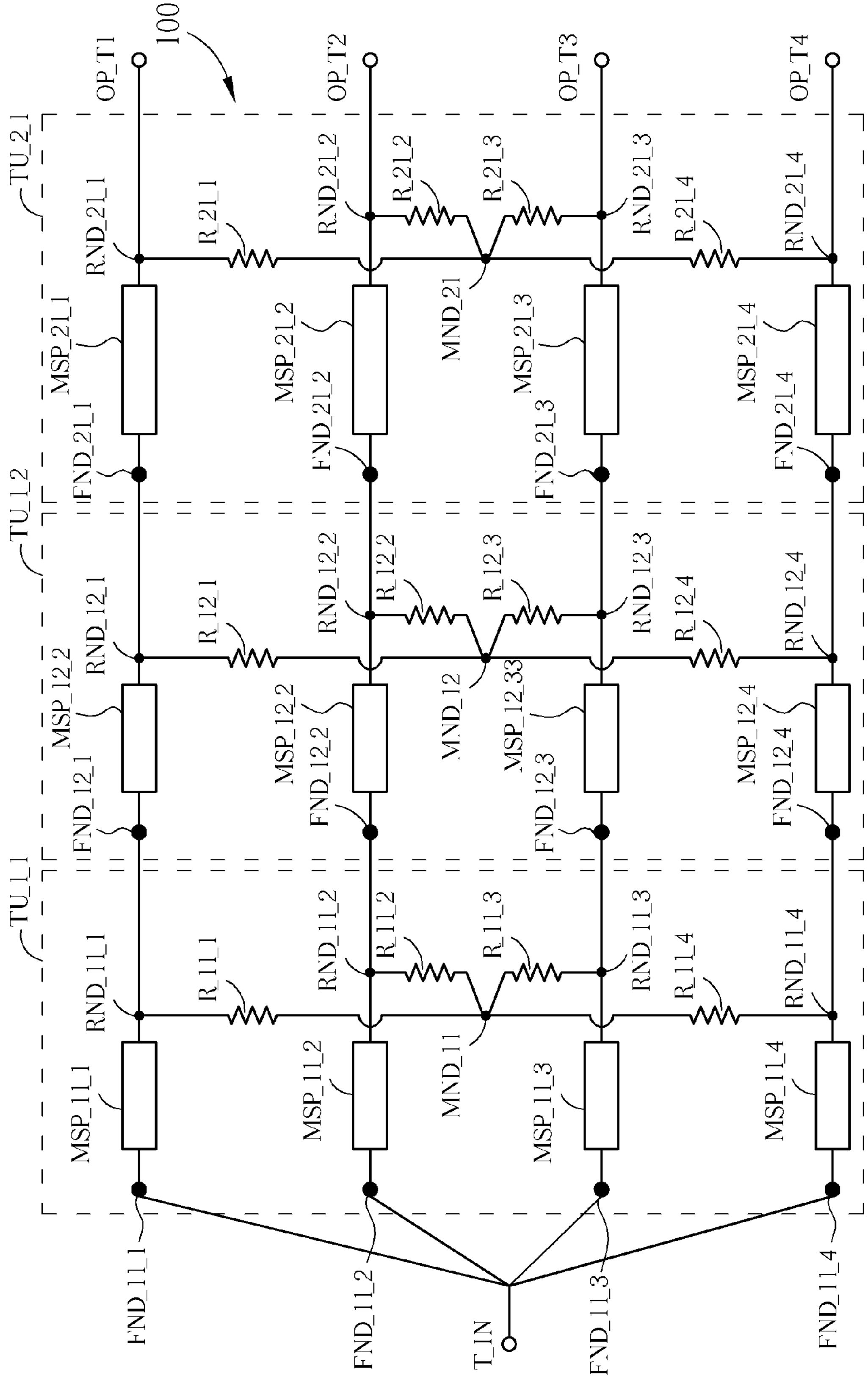
FIG. 10 is a schematic diagram of a splitter according to an embodiment of the present invention.
Figure 11:
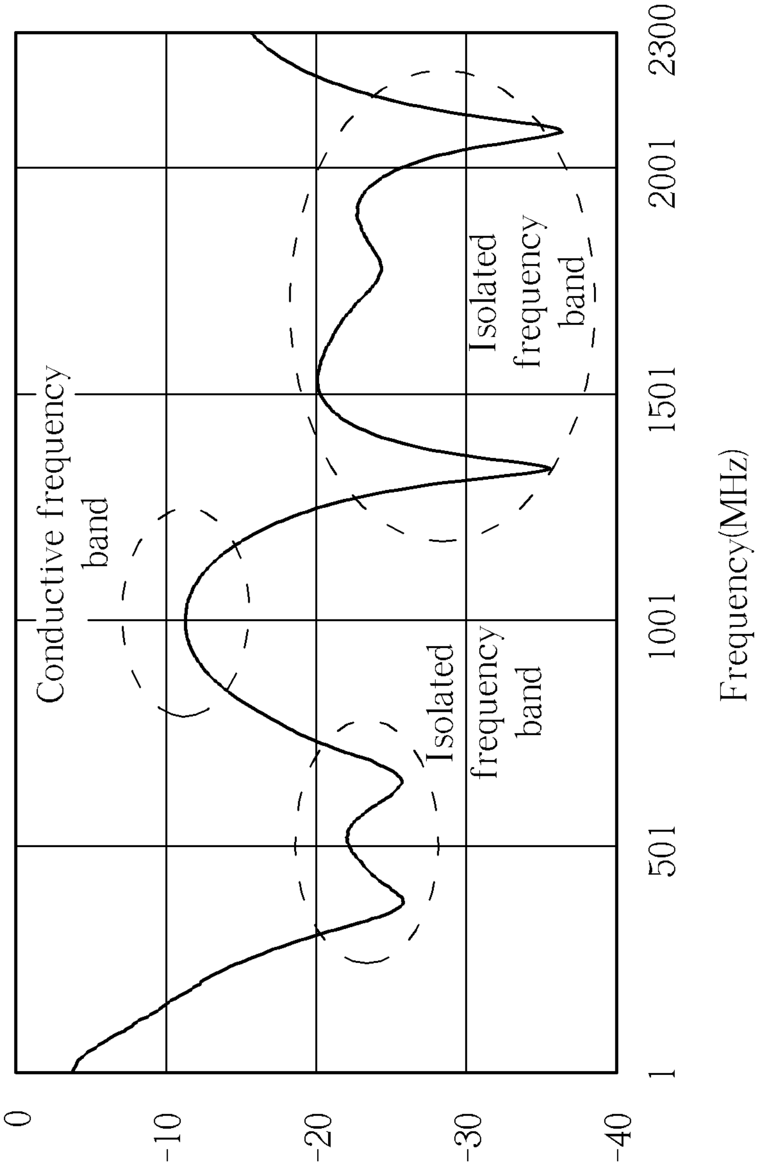
FIG. 11 is a schematic diagram of isolation between the output terminals of the splitter in FIG. 10.

On the other hand, as mentioned above, the parameter n is related to the amount of the output terminals, and can be properly adjusted. For example, please refer to FIG. 10, which is a schematic diagram of a splitter 100 according to an embodiment of the present invention. The splitter 100 is derived from the splitter 10, so the same elements are denoted by the same symbols, and since the structure of the splitter 100 is simpler, notations of the transmitting unit modules are omitted, which can be referred to the above illustration. In detail, the splitter 100 is an example of the splitter 10 with x=2, n=4, a1=2, and a2=1. In other words, the splitter 100 is an example applied to allow four output terminals to be isolated within two frequency bands and conductive at other frequencies. Please continue to refer to FIG. 11, which is a schematic diagram of isolation between the output terminals of the splitter 100. As can be seen, the output terminals of the splitter 100 have higher isolation at frequencies near 500 MHz and 1500 MHz and lower isolation at frequencies near 1000 MHz, such that the output terminals OP_T1-OP_T4 can communicate with each other at frequency bands near 1000 MHz, and preserve a high isolation at frequency bands near 500 MHz and 1500 MHz.

In the conventional art, the basic design requirements of the splitter include low insertion loss from the input terminal to each output terminal and high insertion loss between the output terminals, and such a design concept can not be adapted to applications which require lower isolation within certain frequency bands and higher isolation at other frequencies. In comparison, the present invention utilizes the transmitting units with the different microstrip lengths to allow the output terminals of the splitter to be conductive within certain frequency bands and isolated at other frequencies, so as to realize a function which cannot be achieved by the conventional splitters.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A splitter, comprising:
an input terminal;
a first output terminal;
a second output terminal;
a first transmitting unit, comprising:
a first microstrip, coupled between the input terminal and a first node;
a second microstrip, coupled between the input terminal and a second node; and
a first resistor, coupled between the first node and the second node; and
a second transmitting unit, comprising:
a third microstrip, coupled between the first node and the first output terminal;
a fourth microstrip, coupled between the second node and the second output terminal; and
a second resistor, coupled between the first output terminal and the second output terminal;
wherein lengths of the first microstrip and the second microstrip are substantially equal to a first length related to a first frequency, lengths of the third microstrip and the fourth microstrip are substantially equal to a second length related to a second frequency, and the first frequency and the second frequency are different;
wherein the first output terminal and the second output terminal are substantially isolated within a first frequency band and a second frequency band, and the first output terminal and the second output terminal are substantially conductive at frequencies out of the first frequency band and the second frequency band;
wherein a center frequency of the first frequency band is the first frequency, and a center frequency of the second frequency band is the second frequency.

2. The splitter of claim 1, wherein the first length is substantially equal to a quarter of a wavelength of a first radio frequency signal corresponding to the first frequency, and the second length is substantially equal to a quarter of a wavelength of a second radio frequency signal corresponding to the second frequency.

3. The splitter of claim 1, wherein the first length and the second length are substantially multiplicative with each other.

4. A splitter, comprising:
an input terminal;
a plurality of output terminals; and
a plurality of transmitting units, serially connected as a sequence, each transmitting unit comprising:
a resistor node;
a plurality of front-stage nodes;
a plurality of back-stage nodes;
a plurality of microstrips, coupled between the plurality of front-stage nodes and the plurality of back-stage nodes; and
a plurality of resistors, each of the resistors coupled between one of the plurality of back-stage nodes and the resistor node;
wherein the plurality of front-stage nodes of a forefront transmitting unit among the plurality of transmitting units are coupled to the input terminal, the plurality of back-stage nodes of a last transmitting unit among the plurality of transmitting units are coupled to the plurality of output terminals, and the plurality of back-stage nodes of a former transmitting unit of two adjacent transmitting units are the plurality of front-stage nodes of a latter transmitting unit of the two adjacent transmitting units;
wherein lengths of the plurality of microstrips of each of the transmitting units are substantially equal and related to a frequency, and the plurality of transmitting units are related to a plurality of frequencies according to microstrip lengths, such that the plurality of transmitting units are divided into a plurality of transmitting unit modules according to the lengths of the plurality of microstrips of each of the transmitting units;

wherein the plurality of output terminals are substantially isolated within a plurality of frequency bands, and the plurality of output terminals are substantially conductive at frequencies out of the plurality of frequency bands;

wherein a center frequency of each of the plurality of frequency bands is a frequency of the plurality of frequencies.

5. The splitter of claim 4, wherein the lengths of the plurality of microstrips of each of the transmitting units are substantially equal to a quarter of a wavelength of a radio frequency signal corresponding to the frequency.

6. The splitter of claim 4, wherein a first transmitting unit and a second transmitting unit in one of the plurality of transmitting unit modules are separated by a third transmitting unit in another one of the plurality of transmitting unit modules.

7. The splitter of claim 4, wherein each of the transmitting units in one of the plurality of transmitting unit modules is serially connected together.

* * * * *